US012010906B2

(12) United States Patent
Hong et al.

(10) Patent No.: US 12,010,906 B2
(45) Date of Patent: Jun. 11, 2024

(54) DISPLAY DEVICE INCLUDING THROUGH HOLE CONNECTING ORGANIC LAYER TO SUBSTRATE

(71) Applicant: Samsung Display Co., Ltd., Yongin-si (KR)

(72) Inventors: Jongho Hong, Yongin-si (KR); Sangwoo Kim, Yongin-si (KR); Jaemin Shin, Yongin-si (KR); Junhyeong Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 336 days.

(21) Appl. No.: 17/288,317

(22) PCT Filed: Aug. 1, 2019

(86) PCT No.: PCT/KR2019/009626
§ 371 (c)(1),
(2) Date: Apr. 23, 2021

(87) PCT Pub. No.: WO2020/085625
PCT Pub. Date: Apr. 30, 2020

(65) Prior Publication Data

US 2021/0376269 A1 Dec. 2, 2021

(30) Foreign Application Priority Data

Oct. 23, 2018 (KR) ........................ 10-2018-0126866

(51) Int. Cl.
*H10K 50/84* (2023.01)
*H10K 50/844* (2023.01)
(Continued)

(52) U.S. Cl.
CPC ......... *H10K 77/111* (2023.02); *H10K 50/844* (2023.02); *H10K 59/12* (2023.02);
(Continued)

(58) Field of Classification Search
CPC .. H10K 50/844; H10K 50/80; H10K 50/8445; H10K 50/818; H10K 50/828;
(Continued)

(56) References Cited

U.S. PATENT DOCUMENTS 7,728,510 B2 6/2010 Oh
8,319,209 B2 11/2012 Takei
(Continued)

FOREIGN PATENT DOCUMENTS

CN 107564941 A * 1/2018 ............. H01L 27/32
CN 107706224 A * 2/2018 ......... H01L 27/3244
(Continued)

OTHER PUBLICATIONS

International Search Report for corresponding Application No. PCT/KR2019/009626 dated Nov. 11, 2019, 5 pp.
(Continued)

*Primary Examiner* — Ida M Soward
(74) *Attorney, Agent, or Firm* — Lewis Roca Rothgerber Christie LLP

(57) ABSTRACT

Provided is a display device capable of displaying a high-quality image even under high temperature conditions, the display device including a flexible substrate, a pixel circuit layer arranged on the flexible substrate, and including a thin-film transistor and a through hole extending to the flexible substrate, a first organic layer arranged on the pixel circuit layer and in contact with the flexible substrate through the through hole, an inorganic layer arranged on the first organic layer to cover an upper surface of the first organic layer, a pixel electrode arranged on the inorganic layer, and an encapsulation layer arranged on the pixel electrode, and including a first inorganic encapsulation layer, a second inorganic encapsulation layer, and an organic
(Continued)

encapsulation layer between the first inorganic encapsulation layer and the second inorganic encapsulation layer.

23 Claims, 16 Drawing Sheets

(51) Int. Cl.

| | |
|---|---|
| ***H10K 59/12*** | (2023.01) |
| ***H10K 77/10*** | (2023.01) |
| *G02F 1/1333* | (2006.01) |
| *G06F 1/16* | (2006.01) |
| *G09F 9/30* | (2006.01) |
| *G09G 3/00* | (2006.01) |
| *G09G 3/3233* | (2016.01) |
| *H10K 50/818* | (2023.01) |
| *H10K 50/828* | (2023.01) |
| *H10K 59/121* | (2023.01) |
| *H10K 59/122* | (2023.01) |
| *H10K 59/35* | (2023.01) |
| *H10K 102/00* | (2023.01) |

(52) U.S. Cl.

CPC ...... *G02F 1/133305* (2013.01); *G06F 1/1641* (2013.01); *G06F 1/1652* (2013.01); *G09F 9/301* (2013.01); *G09G 3/035* (2020.08); *G09G 3/3233* (2013.01); *G09G 2300/0809* (2013.01); *H10K 50/818* (2023.02); *H10K 50/828* (2023.02); *H10K 59/121* (2023.02); *H10K 59/1216* (2023.02); *H10K 59/122* (2023.02); *H10K 59/351* (2023.02); *H10K 2102/311* (2023.02)

(58) Field of Classification Search

CPC ...... H10K 59/12; H10K 59/87; H10K 59/124; H10K 59/00; H10K 59/123; H10K 59/352; H10K 59/353; H10K 59/351; H10K 59/1216; H10K 59/122; H10K 77/111; H10K 59/121; H10K 2102/311; G06F 1/1641; G06F 1/1652; G09G 3/035; G09G 3/3233; G09G 2300/0809; G09F 9/301; G02F 1/133305

See application file for complete search history.

(56) References Cited

U.S. PATENT DOCUMENTS

| | | | | |
|---|---|---|---|---|
| 8,536,580 | B2 | 9/2013 | Kang | |
| 8,796,701 | B2 | 8/2014 | Nishiyama et al. | |
| 8,916,876 | B2 | 12/2014 | Jeon et al. | |
| 9,799,708 | B2 | 10/2017 | Hong et al. | |
| 9,991,462 | B2 | 6/2018 | Park et al. | |
| 10,038,163 | B2 | 7/2018 | Kim et al. | |
| 10,468,629 | B2 * | 11/2019 | Choi | H10K 50/80 |
| 10,665,617 | B2 * | 5/2020 | Cho | H10K 71/00 |
| 11,121,199 | B1 | 9/2021 | Chen | |
| 2009/0174322 | A1 * | 7/2009 | Chan | H10K 59/131 313/504 |
| 2010/0200875 | A1 | 8/2010 | Takei | |
| 2012/0119235 | A1 | 5/2012 | Nishiyama et al. | |
| 2013/0009162 | A1 | 1/2013 | Kang | |
| 2014/0183472 | A1 * | 7/2014 | Kim | H10K 59/124 438/34 |
| 2016/0035806 | A1 * | 2/2016 | Park | H10K 50/8445 257/40 |
| 2016/0233253 | A1 * | 8/2016 | Kim | H01L 29/78696 |
| 2016/0372705 | A1 | 12/2016 | Hack et al. | |
| 2017/0125505 | A1 * | 5/2017 | Oh | H10K 59/131 |
| 2017/0200775 | A1 * | 7/2017 | Kim | H10K 59/124 |
| 2017/0288168 | A1 * | 10/2017 | Kim | H10K 50/844 |
| 2018/0061918 | A1 | 3/2018 | Park et al. | |
| 2018/0145125 | A1 * | 5/2018 | Lee | H10K 59/1213 |
| 2018/0342707 | A1 * | 11/2018 | Lee | H10K 71/00 |
| 2018/0366586 | A1 * | 12/2018 | Son | H01L 27/1255 |
| 2019/0012031 | A1 * | 1/2019 | Kim | H10K 71/00 |
| 2019/0096974 | A1 * | 3/2019 | Kim | H10K 50/84 |
| 2019/0131368 | A1 * | 5/2019 | Zhang | H10K 59/1213 |
| 2019/0164998 | A1 * | 5/2019 | Cho | H10K 50/844 |
| 2019/0181198 | A1 * | 6/2019 | Son | H10K 59/124 |

FOREIGN PATENT DOCUMENTS

| | | | | |
|---|---|---|---|---|
| CN | 108550612 | A * | 9/2018 | H01L 21/77 |
| CN | 108550612 | A | 9/2018 | |
| EP | 1 435 661 | A2 | 7/2004 | |
| JP | 2010-182582 | A | 8/2010 | |
| JP | 4600857 | B2 | 12/2010 | |
| KR | 10-0712111 | B1 | 4/2007 | |
| KR | 10-2013-0005877 | A | 1/2013 | |
| KR | 10-1739384 | B1 | 5/2017 | |
| KR | 10-2017-0123896 | A | 11/2017 | |
| KR | 10-2018-0025104 | A | 3/2018 | |
| KR | 10-2018-0051315 | A | 5/2018 | |

OTHER PUBLICATIONS

Lee et al.; A Review of Flexible OLEDs Toward Highly Durable Unusual Displays; IEEE Transactions On Electron Devices, vol. 64, No. 5, May 2017; 10 sheets.

* cited by examiner 140
130
120
109
100
C'
120P
140P
300B
330
322B
310B
TH
PXA3
200
SA
300G
330
322G
310G
TH
PXA2
200
SA
300R
330
322R
310R
120IS
400
430
420
410
TH
PXA1
200
C
120US
120OS
110

400
410
420
430
300R
310R
322R
330
300G
310G
322G
330
300B
310B
322B
330
140P
120P
140
130
120
109
100
D'
D
SA
PXA
TH
200
120US
120OS
110

100
110
109
130
(120) 120P
(140) 140P
300
330
322
310
400
430
420
410
TH
200
SA
PXA
100TH
120IS
120US
120OS

DISPLAY DEVICE INCLUDING THROUGH HOLE CONNECTING ORGANIC LAYER TO SUBSTRATE

CROSS-REFERENCE TO RELATED APPLICATIONS

This application is a U.S. National Phase Patent Application of International Patent Application Number PCT/KR2019/009626, filed on Aug. 1, 2019, which claims priority to Korean Patent Application Number 10-2018-0126866, filed on Oct. 23, 2018, the entire content of all of which is incorporated herein by reference.

BACKGROUND

1. Field

One or more embodiments relate to a display device, and more particularly, to a display device capable of displaying a high-quality image even under high temperature conditions.

2. Detailed Description of Related Art

From among the display devices, organic light-emitting display devices have attracted attention as next-generation display devices because they have the advantages of wide viewing angles, excellent contrast, and fast response times.

In a general organic light-emitting display device, thin-film transistors and organic light-emitting devices are formed on a substrate, and the organic light-emitting devices emit light by themselves. In an organic light-emitting display device, a plurality of inorganic layers including thin-film transistors are stacked on a substrate, and an organic light-emitting element and a plurality of organic layers are formed thereon.

Such an organic light-emitting display device may be used as a display unit of a small product such as a mobile phone or may be used as a display unit of a large product such as a television.

SUMMARY

There has been a problem in that, as an organic light-emitting display device becomes larger, the area of organic layers increases, and when the organic light-emitting display device is exposed to high temperatures, outgassing occurs in the organic layers, resulting in shrinkage of pixels.

To solve various problems including the above problems, one or more embodiments provide a display device capable of displaying a high-quality image even under high-temperature conditions. However, this is only an example, and the scope of the disclosure is not limited thereto.

According to one or more embodiments, a display device includes a flexible substrate, a pixel circuit layer arranged on the flexible substrate, and including a thin-film transistor and a through hole extending to the flexible substrate, a first organic layer arranged on the pixel circuit layer and in contact with the flexible substrate through the through hole, an inorganic layer arranged on the first organic layer to cover an upper surface of the first organic layer, a pixel electrode arranged on the inorganic layer, and an encapsulation layer arranged on the pixel electrode, and including a first inorganic encapsulation layer, a second inorganic encapsulation layer, and an organic encapsulation layer between the first inorganic encapsulation layer and the second inorganic encapsulation layer.

The first organic layer may include a first opening positioned on the thin-film transistor and exposing at least a portion of an upper surface of the pixel circuit layer, and the inorganic layer may cover the first opening.

The inorganic layer may be in contact with the upper surface of the pixel circuit layer exposed by the first opening.

The upper surface of the pixel circuit layer may be an inorganic layer.

The inorganic layer may include a second opening positioned in the first opening, and the pixel electrode may be electrically connected to the thin-film transistor through the second opening.

The pixel circuit layer may further include an inorganic protective layer covering the thin-film transistor and including an inorganic material, and the second opening may extend to penetrate the inorganic protective layer.

The inorganic layer may extend to cover a side surface of the first organic layer.

The through hole and the first organic layer may be filled with a same organic material.

The first organic layer may be in direct contact with the flexible substrate through the through hole.

The display device may further include a second organic layer arranged on the inorganic layer and defining an emission area by covering an edge of the pixel electrode and exposing a central portion of the pixel electrode.

The flexible substrate may include a through pattern penetrating the flexible substrate.

The encapsulation layer may extend to cover an outer surface of the first organic layer.

The first inorganic encapsulation layer of the encapsulation layer may be in surface contact with the outer surface of the first organic layer.

The thin-film transistor may include a semiconductor layer, a gate electrode overlapping at least a portion of the semiconductor layer, and a source electrode and a drain electrode connected to the semiconductor layer, and the first organic layer may include a first opening exposing at least a portion of an upper surface of the pixel circuit layer including at least one of the source electrode or the drain electrode.

The inorganic layer may be in surface contact with the upper surface of the pixel circuit layer exposed through the first opening.

The inorganic layer may include a second opening exposing at least one of the source electrode and the drain electrode.

The pixel electrode may be in electrical contact with at least one of the source electrode or the drain electrode through the second opening.

The flexible substrate may include an organic material.

The first organic layer may contact the flexible substrate through the through hole.

According to one or more embodiments, a display device includes a flexible substrate, a pixel circuit layer arranged on the flexible substrate, and including a plurality of thin-film transistors and at least one through hole extending to the flexible substrate, a first organic layer arranged on the pixel circuit layer, in contact with the flexible substrate through the through hole, and including a plurality of organic pattern parts patterned in an island shape, an inorganic layer arranged on the first organic layer to cover an upper surface of the first organic layer, a first pixel electrode, a second pixel electrode, and a third pixel electrode arranged on the inorganic layer and arranged on the plurality of organic pattern parts, respectively, and an encapsulation layer arranged on the first pixel electrode, the second pixel electrode, and the third pixel electrode, the encapsulation layer including a first inorganic encapsulation layer, a second inorganic encapsulation layer, and an organic encapsulation layer between the first inorganic encapsulation layer and the second inorganic encapsulation layer.

The pixel circuit layer may include an inorganic layer, the inorganic layer may include a separation area in which the plurality of organic pattern parts are spaced apart from each other to expose at least a portion of an upper surface of the inorganic layer, and the inorganic layer may be in contact with the separation area.

The through hole may be provided as at least one through hole under each of the plurality of organic pattern parts to respectively correspond to the plurality of organic pattern parts, and each of the plurality of organic pattern parts may contact the flexible substrate through the at least one through hole.

The display device may further include a first intermediate layer arranged on the first pixel electrode and emitting light of a red wavelength, a second intermediate layer arranged on the second pixel electrode and emitting light of a green wavelength, and a third intermediate layer arranged on the third pixel electrode and emitting light of a blue wavelength, and an opposite electrode covering the first intermediate layer, the second intermediate layer, and the third intermediate layer.

The flexible substrate may include an organic material.

Other aspects of the disclosure will become more apparent from the drawings, the claims, and the detailed description.

According to one or more embodiments, a display device capable of displaying a high-quality image even under high-temperature conditions may be implemented. The scope of the disclosure is not limited to the above aspects.

DETAILED DESCRIPTION

Figure 1:
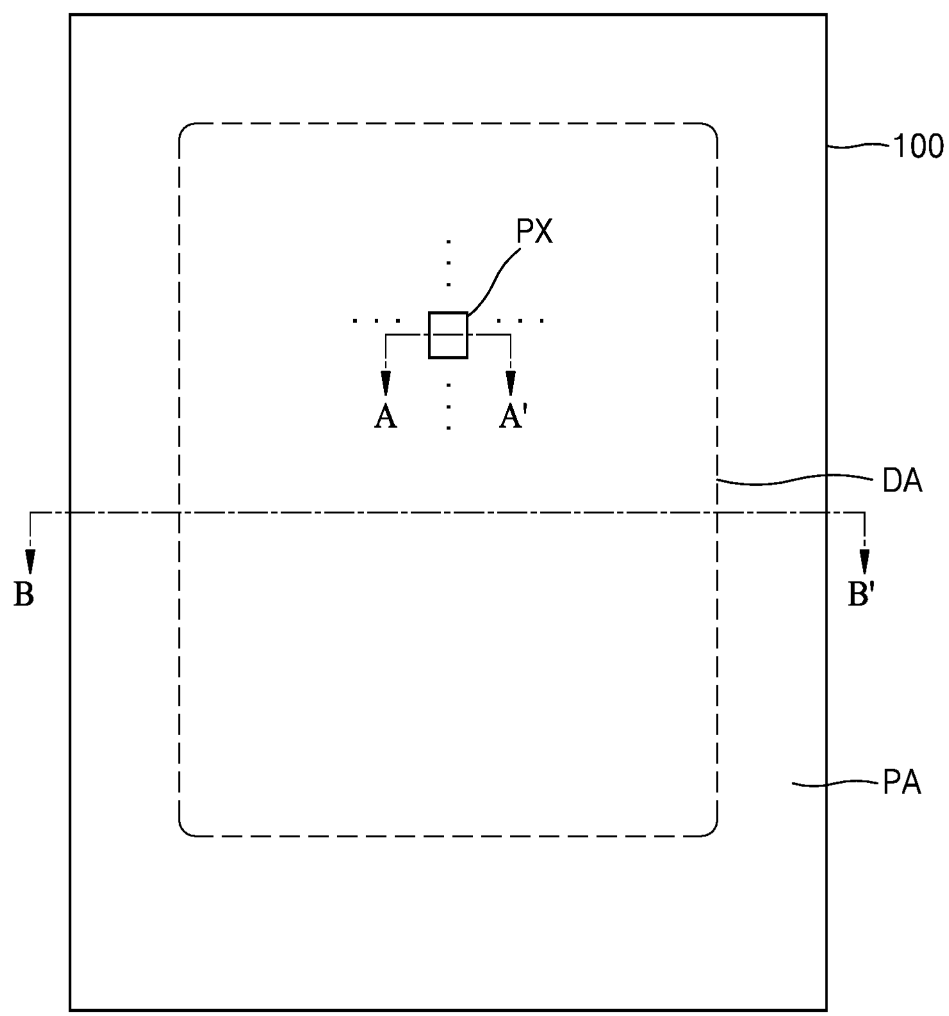
FIG. 1 is a schematic plan view of a display device according to some embodiments.
Figure 1:
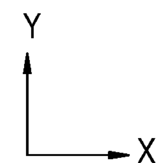

As the disclosure allows for various changes and numerous embodiments, embodiments will be illustrated in the drawings and described in detail in the written description. The aspects of the disclosure, and a method to achieve the same, will be clearer referring to the detailed descriptions below with the drawings. However, the disclosure is not limited to the following embodiments and may be embodied in various forms.

Hereinafter, the disclosure will be described in detail by explaining preferred embodiments of the disclosure with reference to the attached drawings. Like reference numerals in the drawings denote like elements.

It will be understood that although the terms "first," "second," etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that terms such as "comprise," "include," and "have" used herein specify the presence of stated features or elements, but do not preclude the presence or addition of one or more other features or elements.

It will be understood that when a layer, area, or element is referred to as being "on" another layer, area, or element, it may be directly on the other layer, area, or element or may be indirectly on the other layer, area, or element with intervening layers, areas, or elements therebetween.

Sizes of elements in the drawings may be exaggerated for convenience of description. In other words, since sizes and thicknesses of elements in the drawings are arbitrarily illustrated for convenience of description, the following embodiments are not limited thereto.

When a certain example of some embodiments may be implemented differently, a specific process order may be performed differently from the described order. For example, two consecutively described processes may be performed substantially at the same time or may be performed in an order opposite to the described order.

In the following embodiments, it will be understood that when a layer, area, or element is referred to as being "connected to" or "coupled to" another layer, area, or element, it may be directly or indirectly connected or coupled to the other layer, area, or element. That is, for example, intervening layers, areas, or elements may be present. In the following embodiments, it will be understood that when a layer, area, or element is referred to as being "electrically connected to" or "electrically coupled to" another layer, area, and element, it may be directly or indirectly electrically connected or coupled to the other layer, area, or element. That is, for example, intervening layers, areas, or elements may be present.

FIG. 1 is a schematic plan view of a display device according to some embodiments.

Referring to FIG. 1, the display device includes a flexible substrate 100. The flexible substrate 100 may include a display area DA and a peripheral area PA outside the display area DA.

The flexible substrate 100 may include a flexible material. For example, the flexible substrate 100 may include a material that is bendable, foldable, or rollable, such as polyimide (PI). However, this is only an example, and the embodiments are not limited thereto.

A plurality of pixels PX may be arranged in the display area DA. Each pixel PX may include a pixel circuit including a thin-film transistor and a storage capacitor electrically connected to a signal line and a power line, etc., and a display element connected to the above-described pixel circuit, e.g., an organic light-emitting diode (OLED).

Each pixel PX may emit, for example, red, green, blue, or white light from the OLED. In the specification, the pixel PX may be understood as a pixel that emits light of any one of red, green, blue, and white colors as described above. Though not shown, the display area DA may be covered with an encapsulation layer to be protected from external air or moisture. When the display element included in the pixel PX is an OLED, the thin-film transistor may include at least a driving thin-film transistor and/or a switching thin-film transistor.

Figure 2:
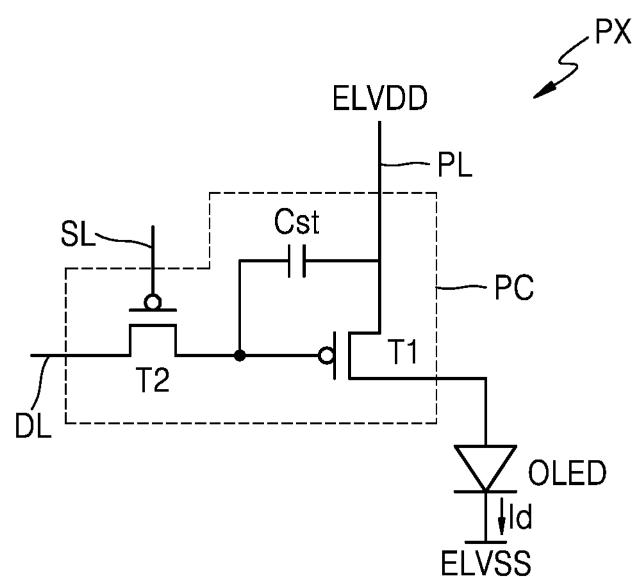
FIG. 2 is an equivalent circuit diagram of a pixel in a display device according to some embodiments.

FIG. 2 is an equivalent circuit diagram of a pixel in a display device according to some embodiments.

Referring to FIG. 2, the pixel PX includes a pixel circuit PC and a display element connected to the pixel circuit PC. In FIG. 2, an organic light-emitting diode OLED is shown as the display element. The pixel circuit PC may include a first thin-film transistor T1, a second thin-film transistor T2, and a storage capacitor Cst.

The second thin-film transistor T2, which is a switching thin-film transistor, may be connected to a scan line SL and a data line DL and may be configured to transmit, to the first thin-film transistor T1, a data voltage input from the data line DL according to a switching voltage input from the scan line SL. The storage capacitor Cst may be connected to the second thin-film transistor T2 and a driving voltage line PL and may be configured to store a voltage corresponding to a difference between a voltage received from the second thin-film transistor T2 and a first power voltage ELVDD supplied from the driving voltage line PL.

The first thin-film transistor T1, which is a driving thin-film transistor, may be connected to the driving voltage line PL and the storage capacitor Cst and may be configured to control a driving current Id flowing through the organic light-emitting diode OLED from the driving voltage line PL in response to a voltage value stored in the storage capacitor Cst. The organic light-emitting diode OLED may emit light with a certain brightness according to the driving current Id. An opposite electrode (e.g., a cathode) of the organic light-emitting diode OLED may receive a second power voltage ELVSS.

Though it is shown in FIG. 2 that the pixel circuit PC includes two thin-film transistors and one storage capacitor, the embodiments are not limited thereto. The number of thin-film transistors and the number of storage capacitors may be variously changed according to the design of the pixel circuit PC.

Figure 3:
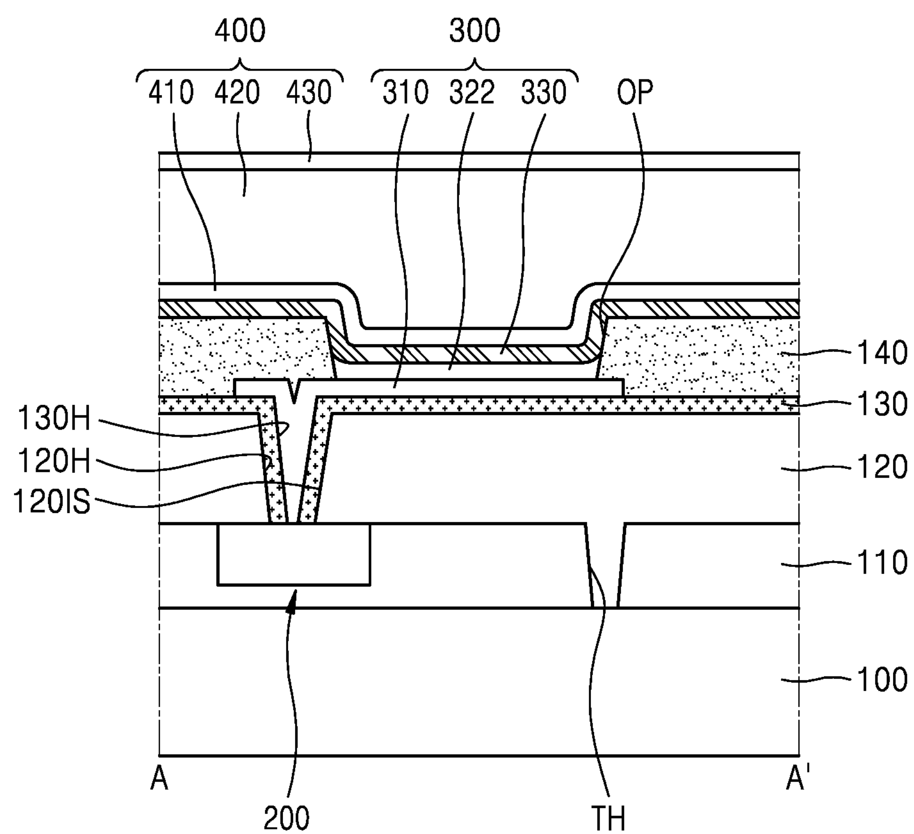
FIG. 3 is a schematic cross-sectional view of a display device according to some embodiments.

FIG. 3 is a schematic cross-sectional view of a display device according to some embodiments. FIG. 3 may correspond to a cross-section of the display device taken along the line A-A' of FIG. 1.

Referring to FIG. 3, a pixel circuit layer 110 including a pixel circuit 200 is arranged on the flexible substrate 100.

The flexible substrate 100 may include a polymer resin, such as polyethersulfone (PES), polyacrylate (PAR), polyetherimide (PEI), polyethylene naphthalate (PEN), polyethylene terephthalate (PET), polyphenylene sulfide (PPS), polyarylate, PI, polycarbonate (PC), or cellulose acetate propionate (CAP).

The pixel circuit layer 110 may include the pixel circuit 200, and the pixel circuit 200 may include a thin-film transistor and a capacitor. The pixel circuit layer 110 may be formed by stacking a plurality of layers.

The pixel circuit 200 may include one or more thin-film transistors and one or more capacitors. In some embodiments, the pixel circuit 200 may include two thin-film transistors and one capacitor, and in other embodiments, the pixel circuit 200 may include seven thin-film transistors and two capacitors. The pixel circuit 200 is not limited to the above-described configuration, and may be designed in various configurations. The configuration of the pixel circuit 200 will be described in detail with reference to FIGS. 4 and 5 to be described later.

A first organic layer 120 is arranged on the pixel circuit layer 110. The first organic layer 120 may cover the pixel circuit layer 110 and serve as a planarization layer for planarizing an upper surface thereof on which a pixel electrode 310 is to be arranged. The first organic layer 120 may include an organic insulating material, such as acryl, benzocyclobutene (BCB), polyimide, or hexamethyldisiloxane (HMDSO).

The first organic layer 120 may include a first opening 120H which is positioned on the pixel circuit 200 and exposes at least a portion of an upper surface of the pixel circuit 200. The pixel circuit 200 and the pixel electrode 310 may be electrically connected to each other through the first opening 120H.

An inorganic layer 130 is arranged on the first organic layer 120. The inorganic layer 130 may be in surface contact with the upper surface of the first organic layer 120 and may be arranged to cover the first organic layer 120. In this regard, the inorganic layer 130 may cover the first opening 120H of the first organic layer 120. The inorganic layer 130 may cover an inner surface 120IS of the first opening 120H and may cover an upper surface of the pixel circuit layer 110 exposed through the first opening 120H. The inorganic layer 130 may include an inorganic insulating material such as silicon oxide ($SiO_x$), silicon nitride ($SiN_x$), and silicon oxynitride (SiON).

The inorganic layer 130 may include a second opening 130H positioned in the first opening 120H of the first organic layer 120. The pixel electrode 310 and the pixel circuit 200 may be electrically connected to each other through the second opening 130H.

A light-emitting element 300 including the pixel electrode 310, an emission layer 322, and an opposite electrode 330 is arranged on the inorganic layer 130.

The pixel electrode 310 is arranged on the inorganic layer 130. The pixel electrode 310 may be arranged for each pixel and may be spaced apart from an adjacent pixel electrode 310. The pixel electrode 310 may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In other embodiments, the first pixel electrode 310 may include a reflective layer including argentum (Ag), magnesium (Mg), aluminum (Al), platinum (Pt), palladium (Pd), aurum (Au), nickel (Ni), neodymium (Nd), iridium (Ir), chromium (Cr), or a compound thereof. In other embodiments, the pixel electrode 310 may further include a layer including ITO, IZO, ZnO, or $In_2O_3$ on and/or below the reflective layer.

A second organic layer 140 covers an edge of the pixel electrode 310 and exposes a central portion of the pixel electrode 310 so as to define an emission area. That is, the second organic layer 140 may be understood as a pixel-defining layer. An upper surface of the central portion of the pixel electrode 310 is exposed through an opening OP of the second organic layer 140. The second organic layer 140 may include an organic insulating material, such as acryl, BCB, polyimide, or HMDSO.

Though not shown, in other embodiments, a spacer (not shown) may be positioned on the second organic layer 140. The spacer (not shown) is in an island type, and a plurality of spacers (not shown) may be arranged to be spaced apart from each other in the display area DA. The spacer (not shown) may include an organic insulating material and/or an inorganic insulating material.

An intermediate layer 320 includes the emission layer 322. The emission layer 322 may include an organic material including a fluorescent or phosphorescent material that emits red, green, and/or blue light, and may be patterned to correspond to the pixel P of the display area DA. The intermediate layer 320 may include at least one of a first functional layer 321 between the emission layer 322 and the pixel electrode 310, and a second functional layer 323 between the emission layer 322 and the opposite electrode 330 (see FIG. 4).

The first functional layer 321 may include at least one of a hole injection layer (HIL) and/or a hole transport layer (HTL). The HIL may facilitate emission of holes from an anode, and the HTL may facilitate transmission of holes of the HIL to the emission layer 322.

The second functional layer 323 may include at least one of an electron transport layer (ETL) and/or an electron injection layer (EIL). The EIL may facilitate emission of electrons from a cathode, and the ETL may facilitate transmission of electrons of the EIL to the emission layer 322.

The opposite electrode 330 is arranged to cover the emission layer 322 and the second organic layer 140. The opposite electrode 330 may be formed as one body to entirely cover the display area DA. In some embodiments, the opposite electrode 330 may include a thin-film metal layer containing Ag and Mg, or a transparent conductive oxide (TCO) such as ITO, IZO, ZnO, $In_2O_3$, IGO, or AZO.

An encapsulation layer 400 is arranged on the pixel P.

The encapsulation layer 400 includes first and second inorganic encapsulation layers 410 and 430 and an organic encapsulation layer 420. For example, the encapsulation layer 400 may be formed by sequentially stacking the first inorganic encapsulation layer 410, the organic encapsulation layer 420, and the second inorganic encapsulation layer 430. The first and second inorganic encapsulation layers 410 and 430 may include at least one material of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The first and second inorganic encapsulation layers 410 and 430 may be formed, for example, in a chemical vapor deposition (CVD) process.

The organic encapsulation layer 420 may include at least one material selected from the group consisting of acrylic resin, methacrylic resin, polyisoprene, vinyl resin, epoxy resin, urethane resin, cellulose resin, or perylene resin.

In some embodiments, the organic encapsulation layer 420 may be formed in an atomic layer deposition (ALD) process in which a material such as HMDSO or tetraethyl orthosilicate (TEOS) is used as a raw material gas.

In some embodiments, the pixel circuit layer 110 includes a through hole TH. The through hole TH passes through the pixel circuit layer 110 and extends to the flexible substrate 100. At least a portion of an upper surface of the flexible substrate 100 is exposed through the through hole TH. The through hole TH may be filled with an organic material, and the first organic layer 120 is arranged on the pixel circuit layer 110 such that a portion of the first organic layer 120 may be buried in the through hole TH. The first organic layer 120 may be in direct contact with the flexible substrate 100 through the through hole TH.

The first organic layer 120 arranged below the second organic layer 140 is a layer including an organic insulating layer, and when energy such as heat or light is applied to the organic insulating layer during or after a display manufacturing process, a phenomenon (outgassing) in which a material in the organic insulating layer is vaporized and discharged to the outside may occur. Gas generated by the outgassing phenomenon may damage layers arranged on the first organic layer 120, for example, the intermediate layer 320 and the opposite electrode 330.

Because an upper surface of a portion in which the pixel electrode 310 is formed needs to be planarized, the first organic layer 120 is formed to have a thickness (e.g., a predetermined thickness) or more. For example, the pixel circuit layer 110 is formed with a thickness of several nm to several hundreds of nm, whereas the first organic layer 120 is formed to be relatively thick with a thickness of about 1 μm to about 2 μm. Because the first organic layer 120 includes an organic insulating material as described above, an outgassing phenomenon in which a material in the first organic layer 120 is vaporized and discharged to the outside occurs. The discharged gas (outgas) may flow in the display device along the organic layer.

As a comparative example, in a display device without the inorganic layer 130, an outgassing phenomenon that occurs in a first organic layer is transferred to a second organic layer and diffused to a light-emitting element along with an outgassing phenomenon that occurs in the second organic layer. The phenomenon may occur in a curing process of an organic layer during a manufacturing process of a display device and may also occur due to high-temperature solar heat after the display device is manufactured. As an example, an organic material is decomposed by ultraviolet rays (UV) irradiated to the display device, and outgas containing O, F, S, etc. is generated and diffused into an emission area of each pixel. The emission area of each pixel is shrunk due to the outgas, which results in a decrease in luminance.

Therefore, in the display device according to some embodiments, in order to prevent the outgas discharged from the first organic layer 120 from flowing toward the second organic layer 140 and causing a defect in the light-emitting element 300, the inorganic layer 130 is provided on the first organic layer 120. Also, the through hole TH is formed in the pixel circuit layer 110 so that the outgas discharged from the first organic layer 120 may flow outward to the flexible substrate 100 through the through hole TH. Through the above-described structure, the outgas discharged from the first organic layer 120 may be blocked from flowing into the light-emitting element 300 and may be effectively discharged to the outside.

Figure 4:
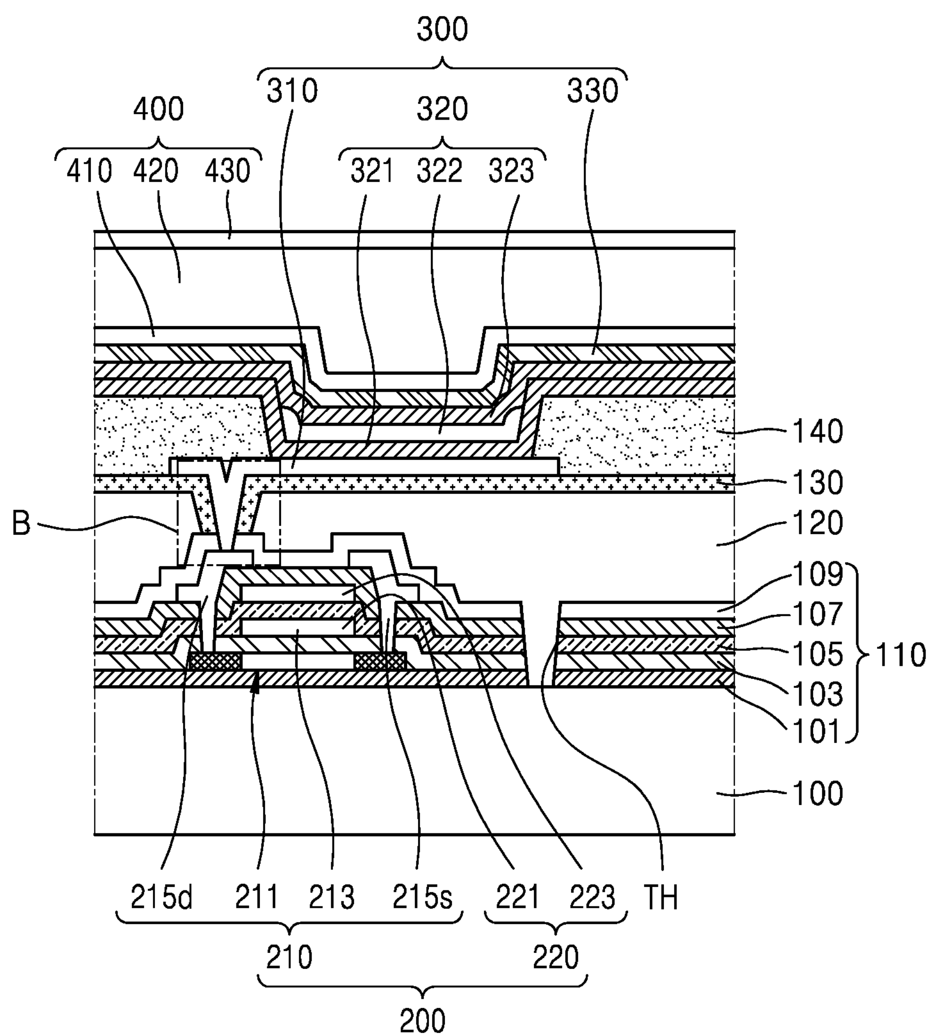
FIG. 4 is a schematic cross-sectional view of a display device according to other embodiments.
Figure 5:
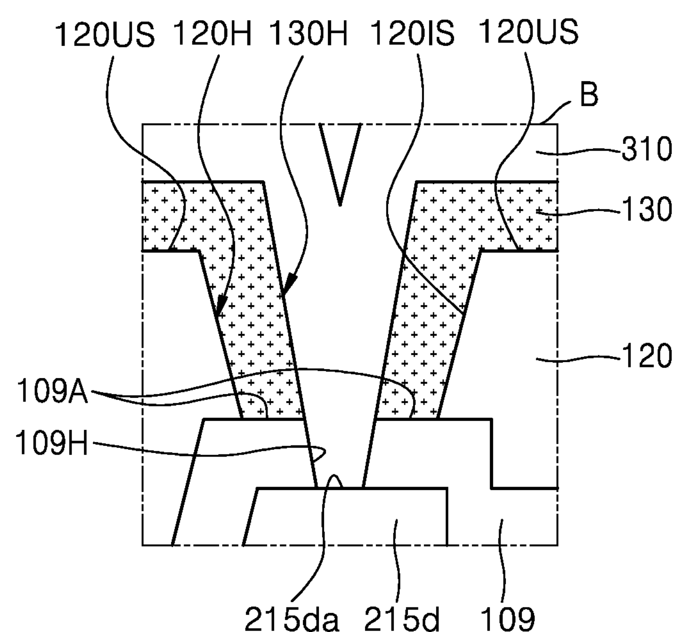
FIG. 5 is an enlarged view of an area of FIG. 4.
Figure 6:
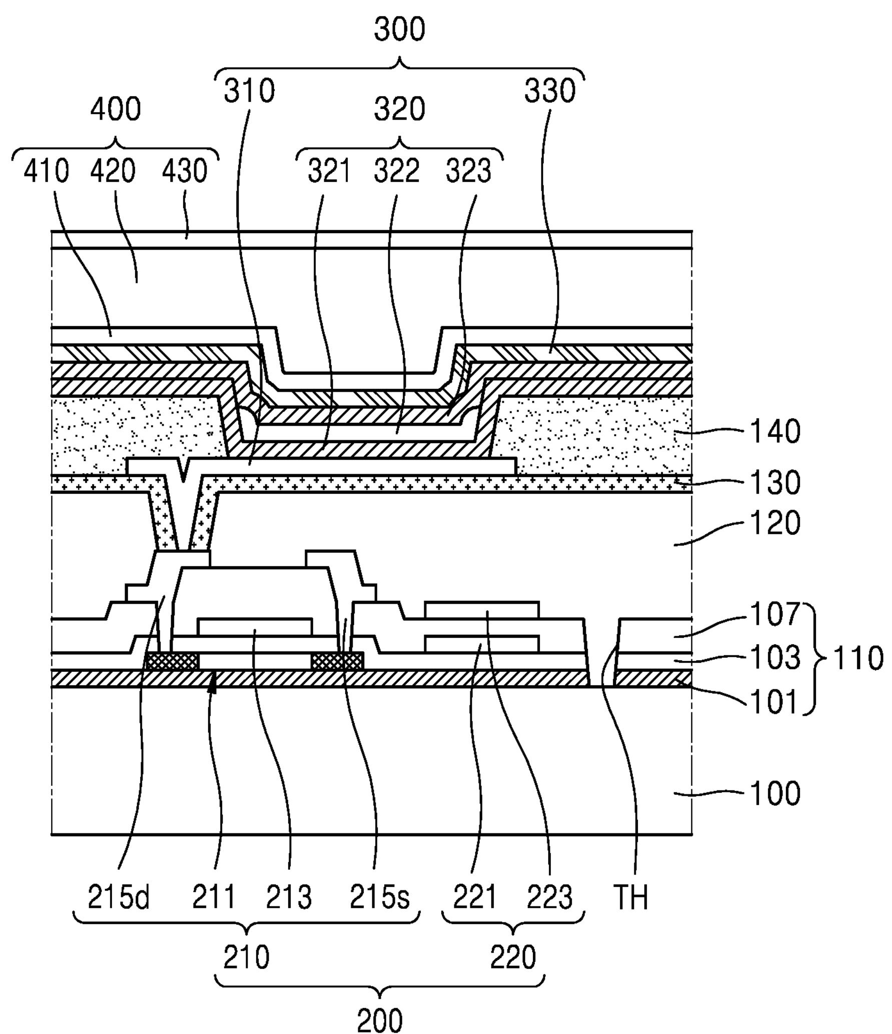
FIG. 6 is a schematic cross-sectional view of a display device according to other embodiments.

FIG. 4 is a schematic cross-sectional view of a display device according to other embodiments, FIG. 5 is an enlarged view of an area of FIG. 4, and FIG. 6 is a schematic cross-sectional view of a display device according to other embodiments. In FIGS. 4 and 6, detailed structures of the pixel circuit 200 and the pixel circuit layer 110 including the pixel circuit 200 are shown. In FIGS. 4 and 6, the structures of the pixel circuit 200 and the pixel circuit layer 110 will be mainly described.

Referring to FIG. 4, the pixel circuit 200 includes a thin-film transistor 210 and a storage capacitor 220. The pixel circuit layer 110 may include a buffer layer 101, a gate insulating layer 103, a dielectric insulating layer 105, an interlayer insulating layer 107, and an inorganic protective layer 109, which are sequentially positioned on the flexible substrate 100.

The buffer layer 101 is arranged on the flexible substrate 100 to reduce/prevent intrusion of impurities, the gate insulating layer 103 is between a semiconductor layer 211 and a gate electrode 213 of the thin-film transistor 210, the dielectric insulating layer 105 is between a lower electrode 221 and an upper electrode 223 of the storage capacitor 220, and the interlayer insulating layer 107 is between the gate electrode 213, a source electrode 215*s*, and a drain electrode 215*d* of the thin-film transistor 210.

The buffer layer 101, the gate insulating layer 103, the dielectric insulating layer 105, the interlayer insulating layer 107, and the inorganic protective layer 109 all include an insulating inorganic material. For example, each of the buffer layer 101, the gate insulating layer 103, the dielectric insulating layer 105, the interlayer insulating layer 107, and the inorganic protective layer 109 may include silicon nitride, silicon oxide, and/or silicon oxynitride.

Though FIG. 4 illustrates a case in which the thin-film transistor 210 and the storage capacitor 220 are arranged to overlap each other so that the gate electrode 213 of the thin-film transistor 210 is the lower electrode 221 of the storage capacitor 220, the embodiments are not limited thereto.

FIG. 5 is an enlarged view of an area of a contact portion B of FIG. 4.

Referring to FIG. 5, the first organic layer 120 includes the first opening 120H corresponding to the drain electrode 215*d* of the thin-film transistor 210, and the inorganic layer 130 includes the second opening 130H formed in the first opening 120H.

The first organic layer 120 may expose a portion of an upper surface 109A of the inorganic protective layer 109 through the first opening 120H. The inorganic layer 130 arranged on the first organic layer 120 may cover an upper surface 120A of the first organic layer 120 and an inner surface 120IS of the first opening 120H. In this regard, the inorganic layer 130 may be in direct contact with and may cover the upper surface 109A of the inorganic protective layer 109 exposed through the first opening 120H.

The second opening 130H is formed in the first opening 120H, and may extend to the drain electrode 215*d* so that an upper surface 215*da* of the drain electrode 215*d* is directly exposed. That is, the second opening 130H may include, or may extend to, a third opening 109H formed in the inorganic protective layer 109, and the second opening 130H and the third opening 109H may be openings formed as one body having a same inner surface. It may be understood that this is because the third opening 109H is also formed simultaneously in a process of forming the second opening 130H.

As shown in FIG. 5, in the area of the contact portion B, the first organic layer 120 may be covered with, or surrounded/partially surrounded by, the inorganic protective layer 109 and the inorganic layer 130.

Referring to FIG. 6, the thin-film transistor 210 and the storage capacitor 220 of the pixel circuit 200 may be arranged at different positions.

According to the structure of the pixel circuit 200, the pixel circuit layer 110 may include the buffer layer 101, the gate insulating layer 103, and the interlayer insulating layer 107, which are sequentially positioned on the flexible substrate 100. As shown in FIG. 4, the interlayer insulating layer 107 may be between the lower electrode 221 and the upper electrode 223 of the storage capacitor 220 and may function as a dielectric.

Though it has been described with respect to FIGS. 4 and 6 that the thin-film transistor 210 of the pixel circuit 200 is a top gate type, the embodiments are not limited thereto. In some embodiments, the thin-film transistor 210 may be a bottom gate type. Furthermore, it has been described in FIG. 6 that the lower electrode 221 and the upper electrode 223 of the storage capacitor 220 are respectively positioned on a same layer as, and so as to include a same material as, the gate electrode 213 and the source and drain electrodes 215*s* and 215*d*. However, the embodiments are not limited thereto and may be variously modified.

Figure 7:
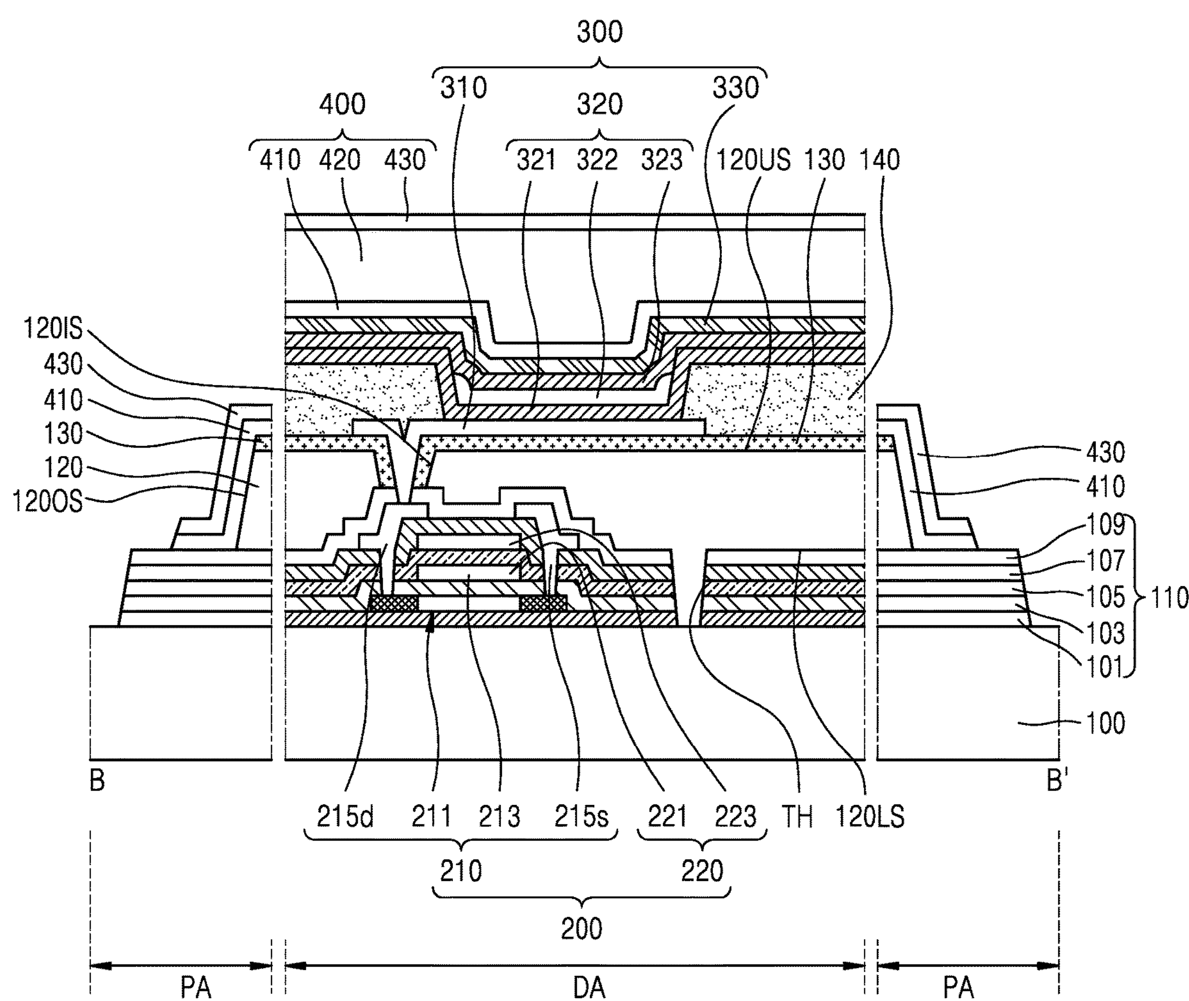
FIGS. 7 to 9 are schematic cross-sectional views of a display device according to other embodiments.
Figure 8:
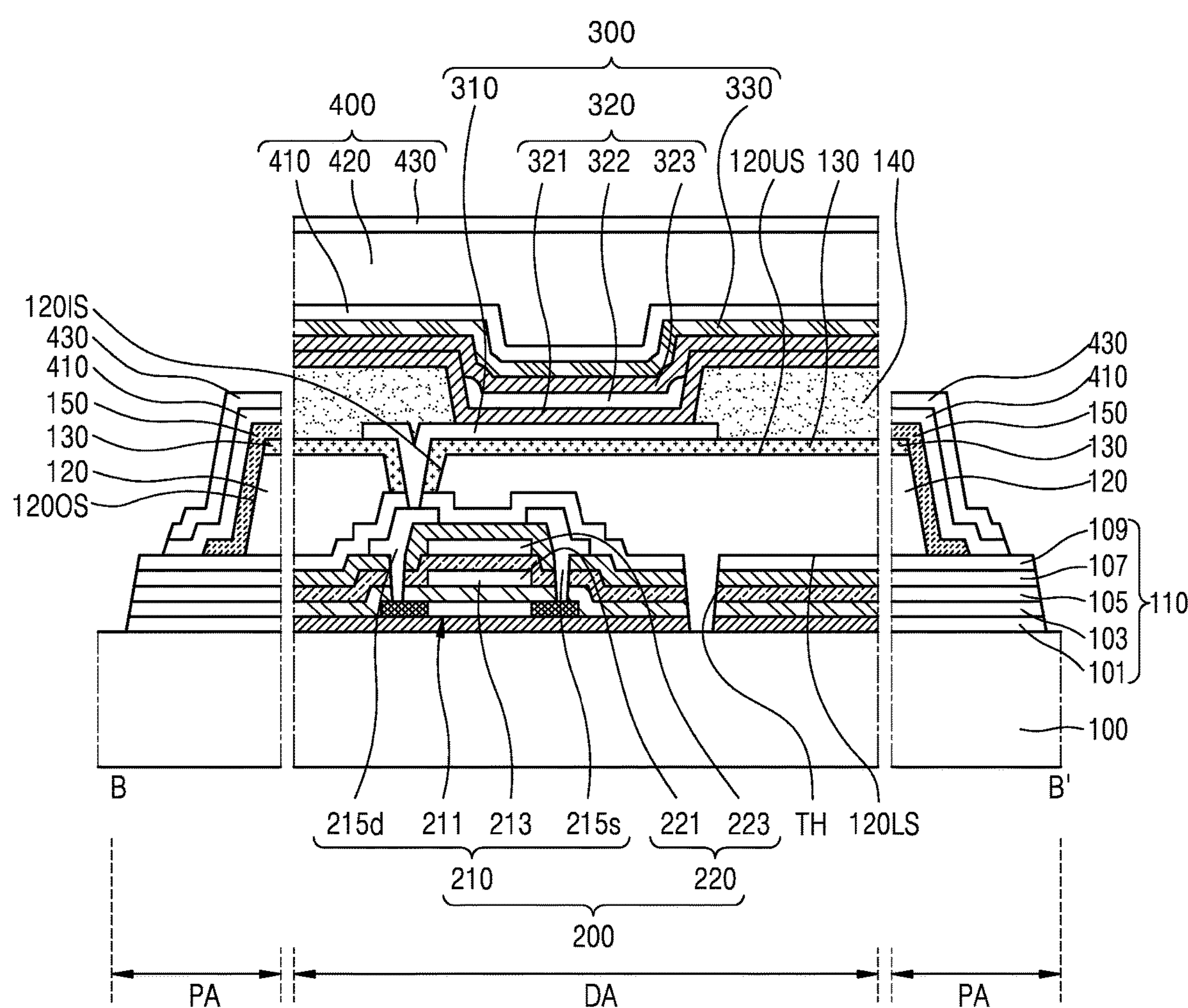
Figure 9:
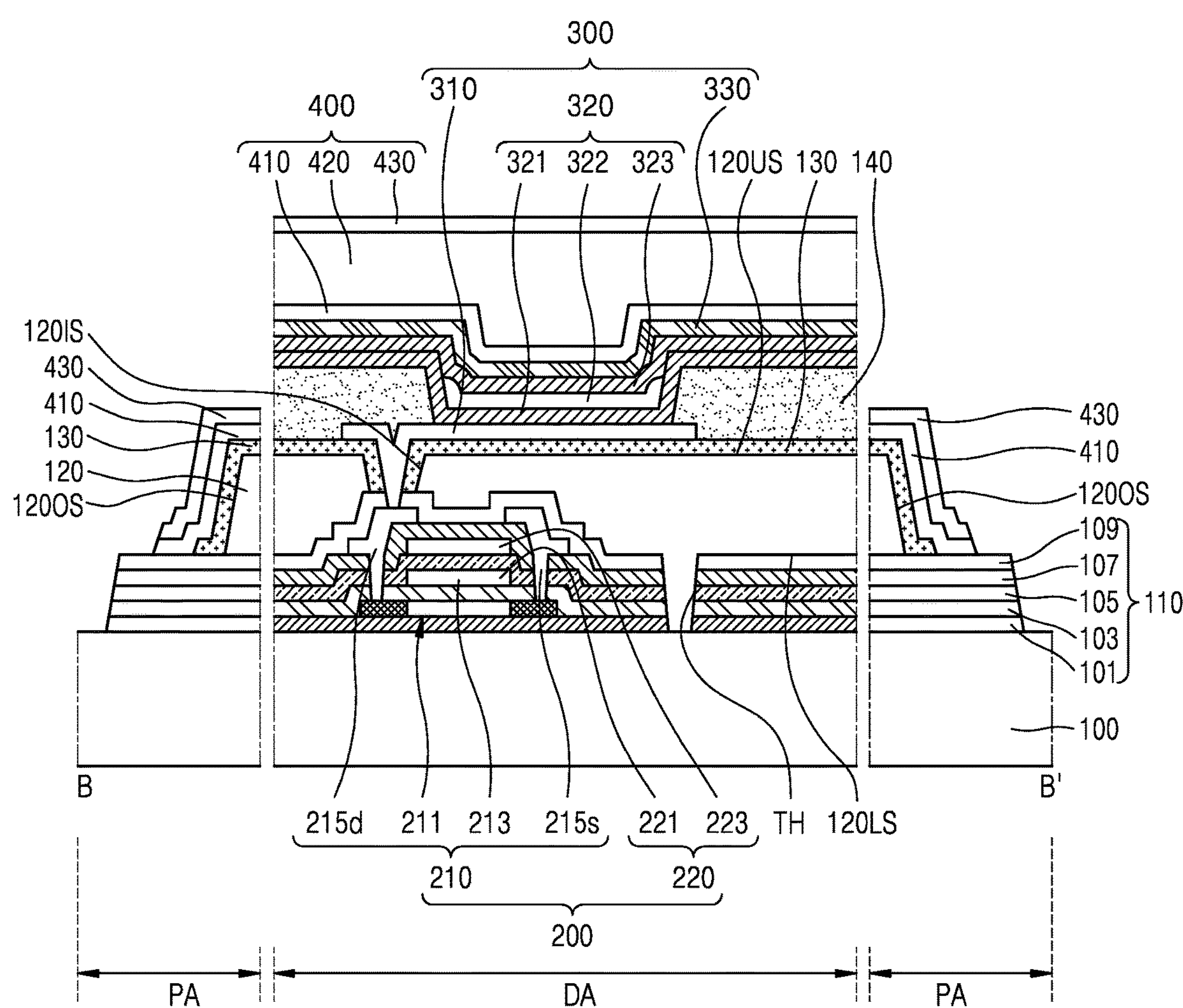

FIGS. 7 to 9 are schematic cross-sectional views of a display device according to other embodiments. FIGS. 7 to 9 may correspond to cross-sections of the display device taken along the line B-B' of FIG. 1.

FIGS. 7 to 9 include the same pixel circuit 200 as in FIG. 4, but are not limited thereto. In FIGS. 7 and 8, the display area DA and the peripheral area PA are shown together. In FIGS. 7 and 9, the display area DA is the same as that of FIG. 4. Hereinafter, a structure of the peripheral area PA will be mainly described.

Referring to FIG. 7, the first organic layer 120 is arranged to extend to the peripheral area PA. The inorganic layer 130 is arranged on the first organic layer 120 and extends to the peripheral area PA along with the first organic layer 120. That is, an upper surface 120US of the first organic layer 120 including the inner surface 120IS of the first opening 120H may be covered with the inorganic layer 130. An outer surface 1200S of the first organic layer 120 arranged on the peripheral area PA may be covered with the first and second inorganic encapsulation layers 410 and 430. The outer surface 1200S of the first organic layer 120 may be in direct contact with the first inorganic encapsulation layer 410.

The inner surface 120IS and the upper surface 120US of the first organic layer 120 are covered with the inorganic layer 130, the outer surface 1200S of the first organic layer 120 is covered with the first inorganic encapsulation layer 410, and a lower surface 120LS of the first organic layer 120 is covered with the inorganic protective layer 109. Accordingly, based on the first organic layer 120, all surfaces of the first organic layer 120, excluding the through hole TH, are covered with, or surrounded/partially surrounded by, the inorganic layers 130, 410, and 109. Therefore, a path through which the outgas discharged from the first organic layer 120 flows may be blocked, and the outgas may be discharged to the flexible substrate 100 through the through hole TH.

In other embodiments, as shown in FIG. 8, the outer surface 1200S of the first organic layer 120 may be covered with a conductive layer 150. In this case, the first and second inorganic encapsulation layers 410 and 430 may be positioned on the conductive layer 150. Though not shown, the conductive layer 150 may be in electrical contact with a power supply line that supplies power to the pixel circuit 200. The conductive layer 150 and the pixel electrode 310 or the opposite electrode 330 may include a same material, but the embodiments are not limited thereto.

Referring to FIG. 9, the inorganic layer 130 may extend to cover the outer surface 1200S of the first organic layer 120. In FIG. 9, the upper surface 120US of the first organic layer 120, including the inner surface 120IS of the first opening 120H, and the outer surface 1200S of the first organic layer 120 are covered with the inorganic layer 130.

The inner surface 120IS, the upper surface 120US, and the outer surface 1200S of the first organic layer 120 are covered with the inorganic layer 130, and the lower surface 120LS of the first organic layer 120 is covered with the inorganic protective layer 109. Accordingly, based on the first organic layer 120, all surfaces of the first organic layer 120, excluding the through hole TH, are covered with the inorganic layers 130 and 109. Therefore, a path through which the outgas discharged from the first organic layer 120 flows may be blocked, and the outgas may be discharged to the flexible substrate 100 through the through hole TH.

Figure 10:
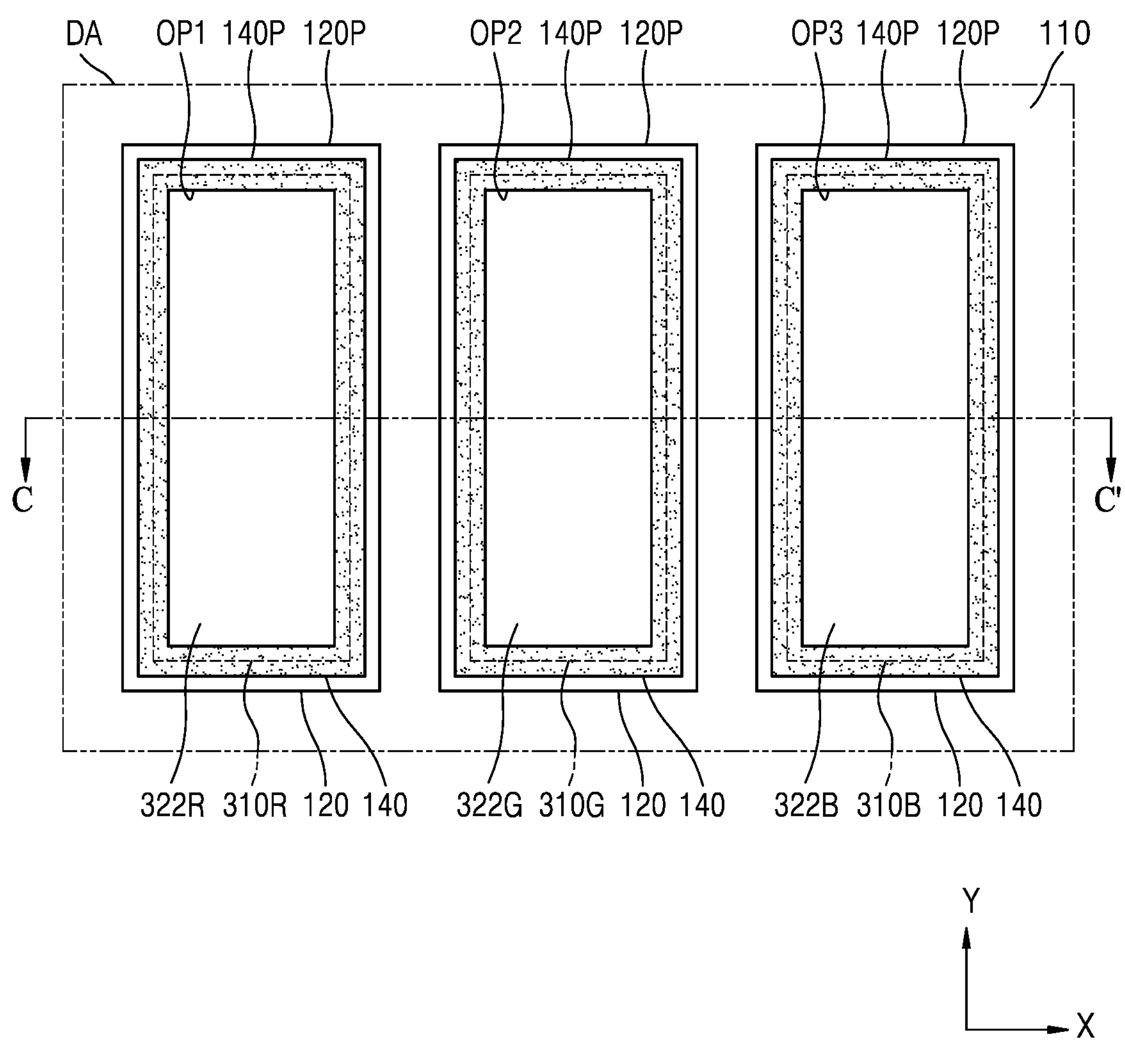
FIGS. 10 and 11 are schematic plan views of a display device according to other embodiments.
Figure 11:
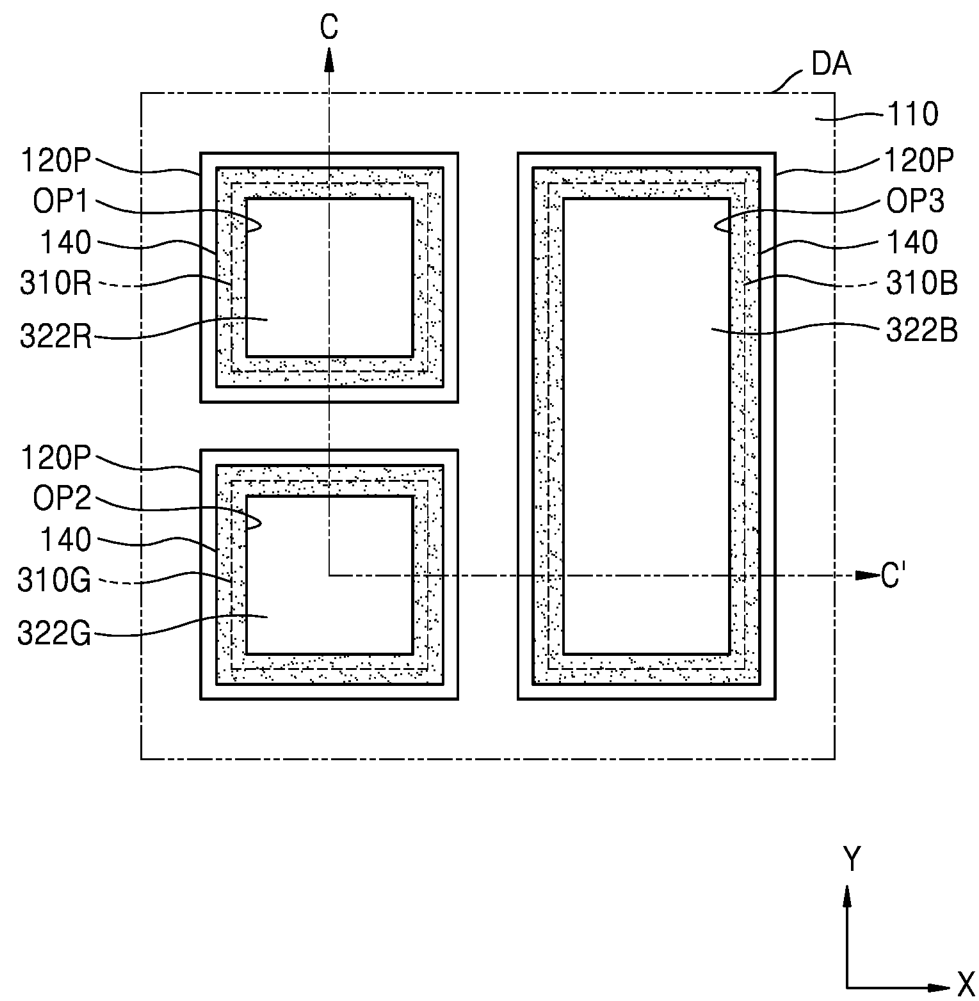
Figure 12:
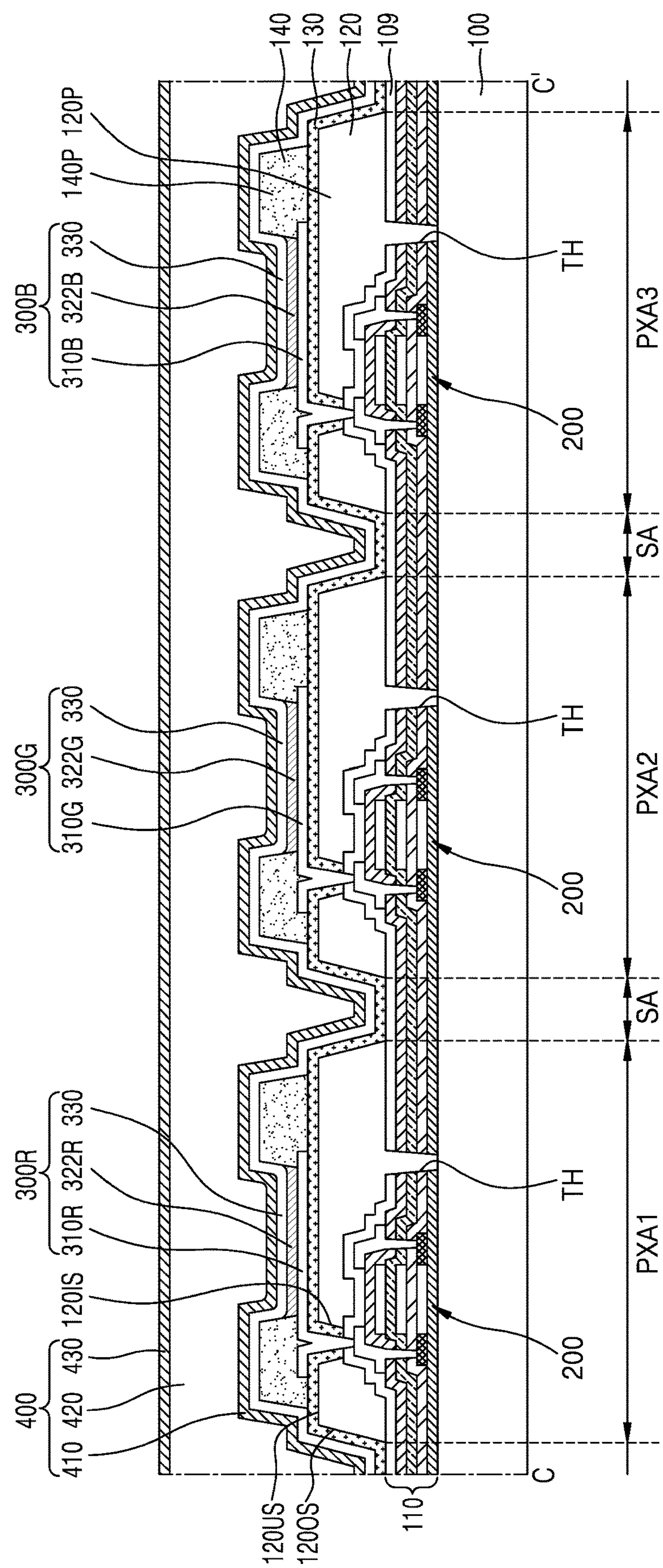
FIG. 12 is a schematic cross-sectional view of a display device according to other embodiments.

FIGS. 10 and 11 are schematic plan views of a display device according to other embodiments, and FIG. 12 is a schematic cross-sectional view of a display device according to other embodiments. FIG. 12 may correspond to a cross-section of the display device taken along the line C-C' of FIGS. 10 and 11. FIGS. 10 to 12 illustrate a plurality of pixels.

Referring to FIGS. 10 to 12, a first pixel electrode 310R, a second pixel electrode 310G, and a third pixel electrode 310B are arranged on the display area DA. The first pixel electrode 310R, the second pixel electrode 310G, and the third pixel electrode 3106 may be provided to emit light of different colors. In some embodiments, the first pixel electrode 310R may be a pixel electrode for emitting red light, the second pixel electrode 310G may be a pixel electrode for emitting green light, and the third pixel electrode 310B may be a pixel electrode for emitting blue light. The first pixel electrode 310R, the second pixel electrode 310G, and the third pixel electrode 310B are positioned on the pixel circuit layer 110, and on the first organic layer 120 on the pixel circuit layer 110.

The first organic layer 120 may include a plurality of first organic pattern parts 120P patterned in an island shape. Upper portions of the first organic pattern parts 120P may be covered with the inorganic layer 130 as shown in FIG. 12.

The pixel electrodes 310R, 310G, and 310B may be arranged in an X-axis direction as shown in FIG. 10 or may be arranged in X-axis and Y-axis directions as shown in FIG. 11. In regard to the pixel electrodes 310R, 310G, and 310B of FIGS. 10 and 11, the first pixel electrode 310R for emitting red light and the second pixel electrode 310G for emitting green light may be formed to have an area that is less than an area of the third pixel electrode 3106 for emitting blue light. The embodiments are not limited thereto, and in addition to the structure of FIG. 11, various forms such as a PENTILE® arrangement structure (PENTILE® is a registered trademark of Samsung Display Co., Ltd., Republic of Korea), etc. may be provided.

Figure 13:
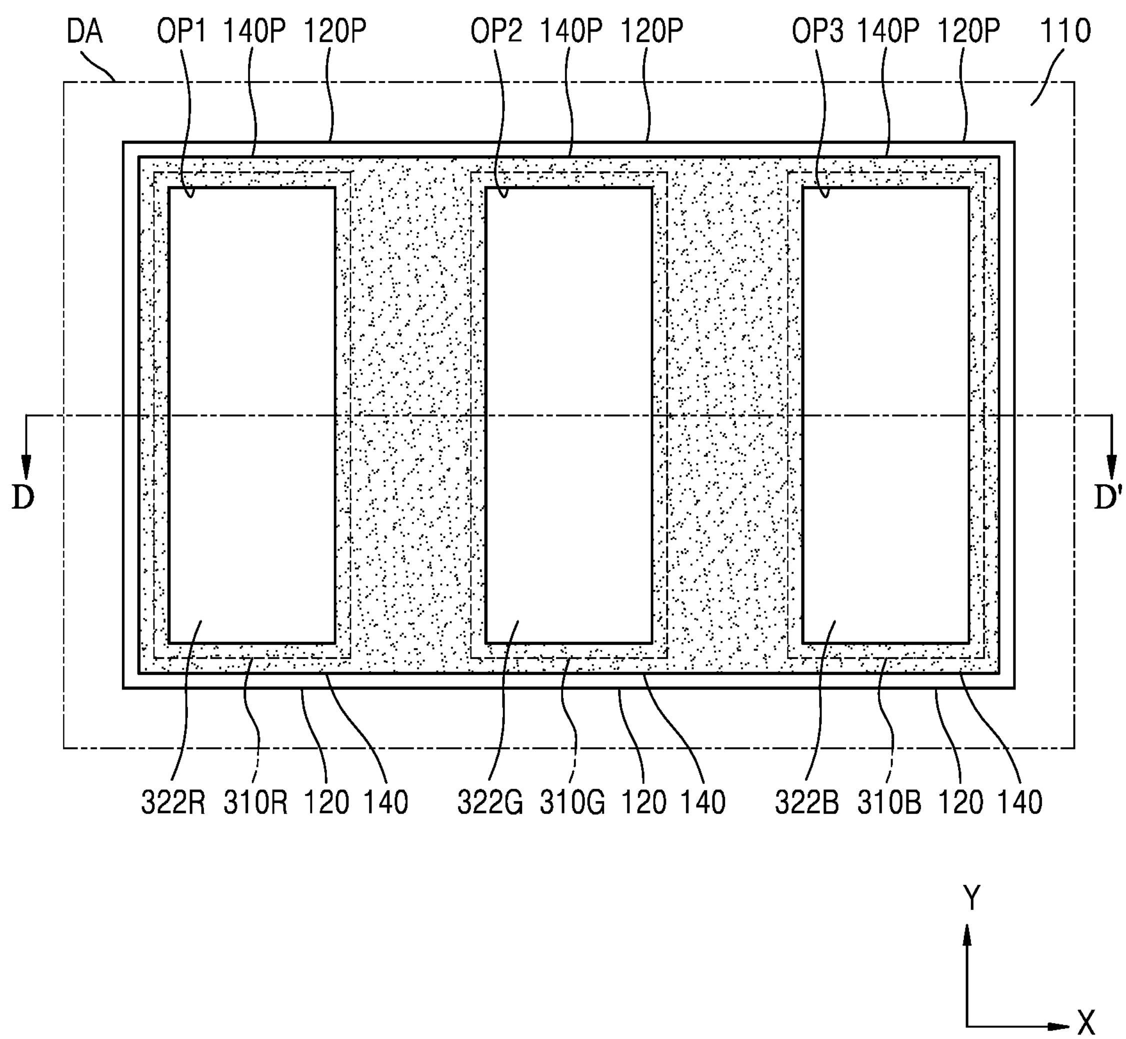
FIGS. 13 and 14 are schematic plan views of a display device according to other embodiments.
Figure 14:
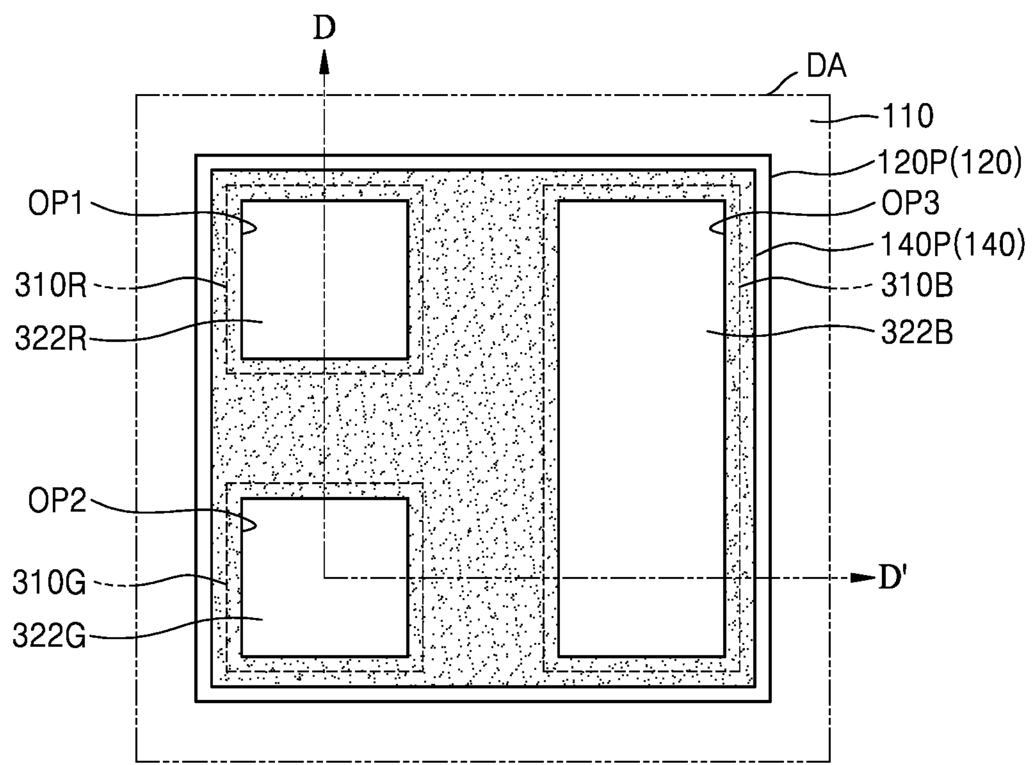

In FIGS. 10 and 11, the first organic pattern parts 120P are patterned for each pixel, that is, for each of the first to third pixel electrodes 310R, 310G, and 310B. In the case of FIGS. 10 and 11, each of the pixel electrodes 310R, 310G, and 310B may be arranged on one first organic pattern part 120P. In other embodiments, as shown in FIGS. 13 and 14, the first organic pattern parts 120P may be patterned in units of the pixel electrodes 310R, 310G, and 310B. In the case of FIGS. 13 and 14, the pixel electrodes 310R, 310G, and 310B may be arranged on one first organic pattern part 120P.

Referring back to FIGS. 10 to 12, the second organic layer 140 that defines the emission area may be arranged on each of the pixel electrodes 310R, 310G, and 3106. The second organic layer 140 is patterned for each of the pixel electrodes 310R, 310G, and 310B, covers edges of the pixel electrodes 310R, 310G, and 310B, and may include openings OP1, OP2, and OP3 that expose central portions of the pixel electrodes 310R, 310G, and 310B, respectively. Emission layers 322R, 322G, and 322B may be arranged on the pixel electrodes 310R, 310G, and 310B exposed through the openings OP1, OP2, and OP3, respectively.

In the embodiments of FIGS. 10 to 13, the second organic layer 140 may include a plurality of second organic pattern parts 140P. That is, the second organic layer 140 is patterned for each of the pixel electrodes 310R, 310G, and 3106, and the second organic pattern parts 140P may correspond to the pixel electrodes 310R, 310G, and 310B, respectively. The second organic pattern parts 140P may be arranged on the pixel electrodes 310R, 310G, and 310B, respectively, to be spaced apart from each other.

Referring to FIG. 13, the pixel circuit layer 110 including the pixel circuit 200 is arranged on the flexible substrate 100. The pixel circuit 200 is arranged to correspond to each of pixel areas PXA1, PXA2, and PXA3. The pixel circuit layer 110 may be arranged on an entire surface of the flexible substrate 100. The pixel circuit layer 110 of FIG. 13 is the same as the pixel circuit layer 110 of FIG. 4 described above, but the embodiments are not limited thereto.

The pixel circuit layer 110 includes a through hole TH that penetrates the pixel circuit layer 110 in the same manner as in the above-described embodiments. At least one through hole TH may be provided for each of pixels 300R, 300G, and 300B.

The first organic layer 120 is arranged on the pixel circuit layer 110. The first organic layer 120 may include a plurality of first organic pattern parts 120P patterned for each of the pixel areas PXA1, PXA2, and PXA3. The first organic pattern parts 120P are arranged to be spaced apart from each other by a distance (e.g., a predetermined distance) with a separation area SA therebetween, and at least a portion of an upper surface of the pixel circuit layer 110 may be exposed through the separation area SA. In FIG. 13, at least a portion of an upper surface of the inorganic protective layer 109 positioned on the uppermost portion of the pixel circuit layer 110 may be exposed through the separation area SA.

The inorganic layer 130 is arranged on the first organic layer 120. The inorganic layer 130 may be formed as one body on the first organic layer 120 and cover the first organic layer 120 including the first organic pattern parts 120P. In some embodiments, the inorganic layer 130 may cover an upper surface 120US, an outer surface 1200S, and an inner surface 120IS of each of the first organic pattern parts 120P.

The second organic layer 140 is arranged on the inorganic layer 130. The second organic layer 140 may include a plurality of second organic pattern parts 140P, and each of the second organic pattern parts 140P may be positioned on each of the first organic pattern parts 120P.

Through the structures of the first organic pattern parts 120P and the second organic pattern parts 140P, areas of organic layers in which outgas may be generated may be reduced, and the pixels 300R, 300G, and 300B may be individually encapsulated by blocking a path through which the organic layers may be in contact with each other between the pixels 300R, 300G, and 300B.

The first organic pattern parts 120P and the second organic pattern parts 140P may not be in contact with each other and may be physically separated from each other by the inorganic layer 130. Accordingly, each of the first organic pattern parts 120P communicates and contacts the flexible substrate 100 including an organic material only through the through hole TH. As described above, the outgas flows along the organic layer, and a path toward the second organic layer 140 is blocked so that the outgas discharged from the first organic layer 120 may be discharged to the flexible substrate 100 through the through hole TH.

Figure 15:
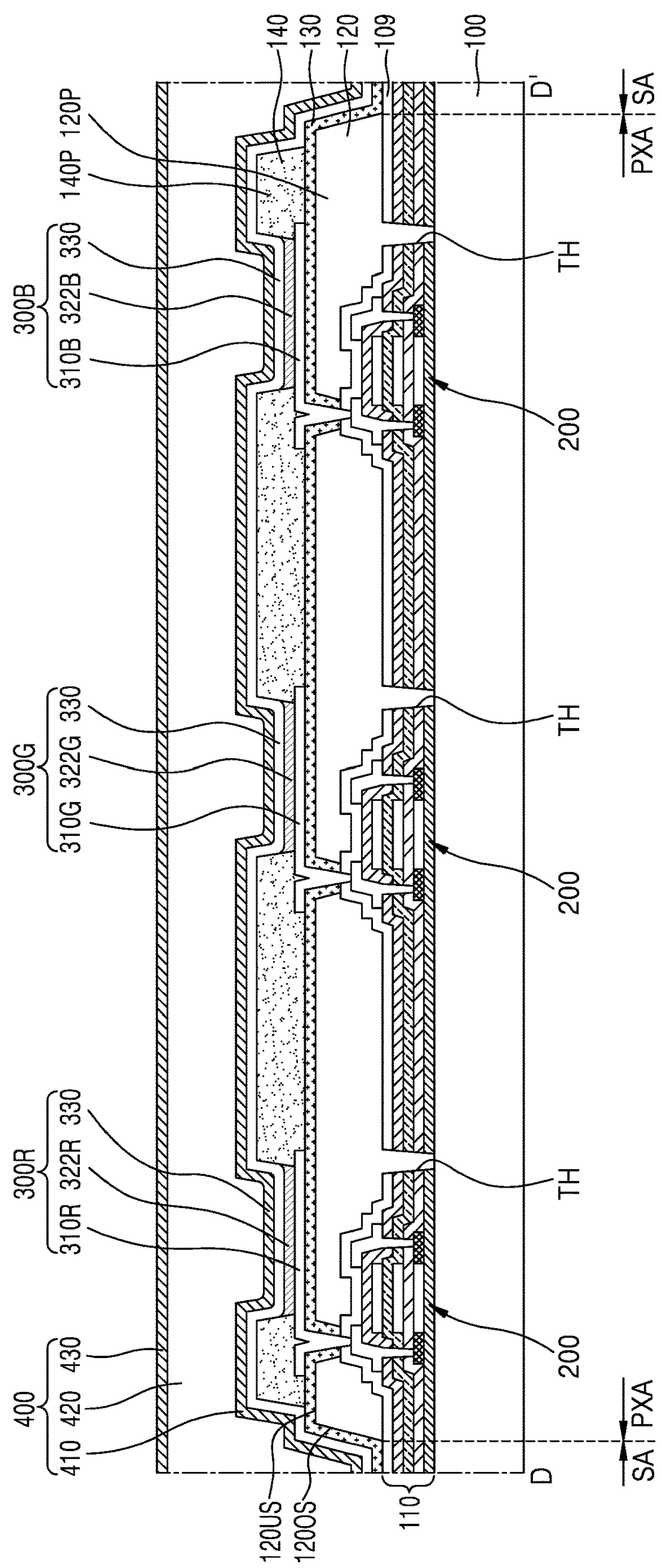
FIG. 15 is a schematic cross-sectional view of a display device according to other embodiments.

FIGS. 13 and 14 are schematic plan views of a display device according to other embodiments, and FIG. 15 is a schematic cross-sectional view of a display device according to other embodiments. FIG. 15 may correspond to a cross-section of the display device) taken along the line D-D' of FIGS. 13 and 14. FIGS. 13 to 15 illustrate a plurality of pixels.

When compared to the embodiments of FIGS. 10 to 12, embodiments of FIGS. 13 to 15 are different in structures of the first organic layer 120 and the second organic layer 140. Because other configurations are the same as those of the embodiments of FIGS. 10 to 12, differences will be mainly described below.

Referring to FIGS. 13 to 15, the first organic layer 120 may include a plurality of first organic pattern parts 120P. In FIGS. 13 to 15, one first organic pattern part 120P is shown. In some embodiments, the first organic pattern part 120P may be patterned in units of the pixel electrodes 310R, 310G, and 310B. That is, the pixel electrodes 310R, 310G, and 310B may be arranged on one first organic pattern part 120P.

The second organic layer 140 may include a plurality of second organic pattern parts 140P. In FIGS. 13 to 15, one second organic pattern part 140P is shown. That is, the second organic pattern part 140P is provided as one body on the first organic pattern parts 120P, and may include openings OP1, OP2, and OP3 that expose the pixel electrodes 310R, 310G, and 310B, respectively.

Through the above-described structure, the pixels 300R, 300G, and 300B may be individually encapsulated.

Figure 16:
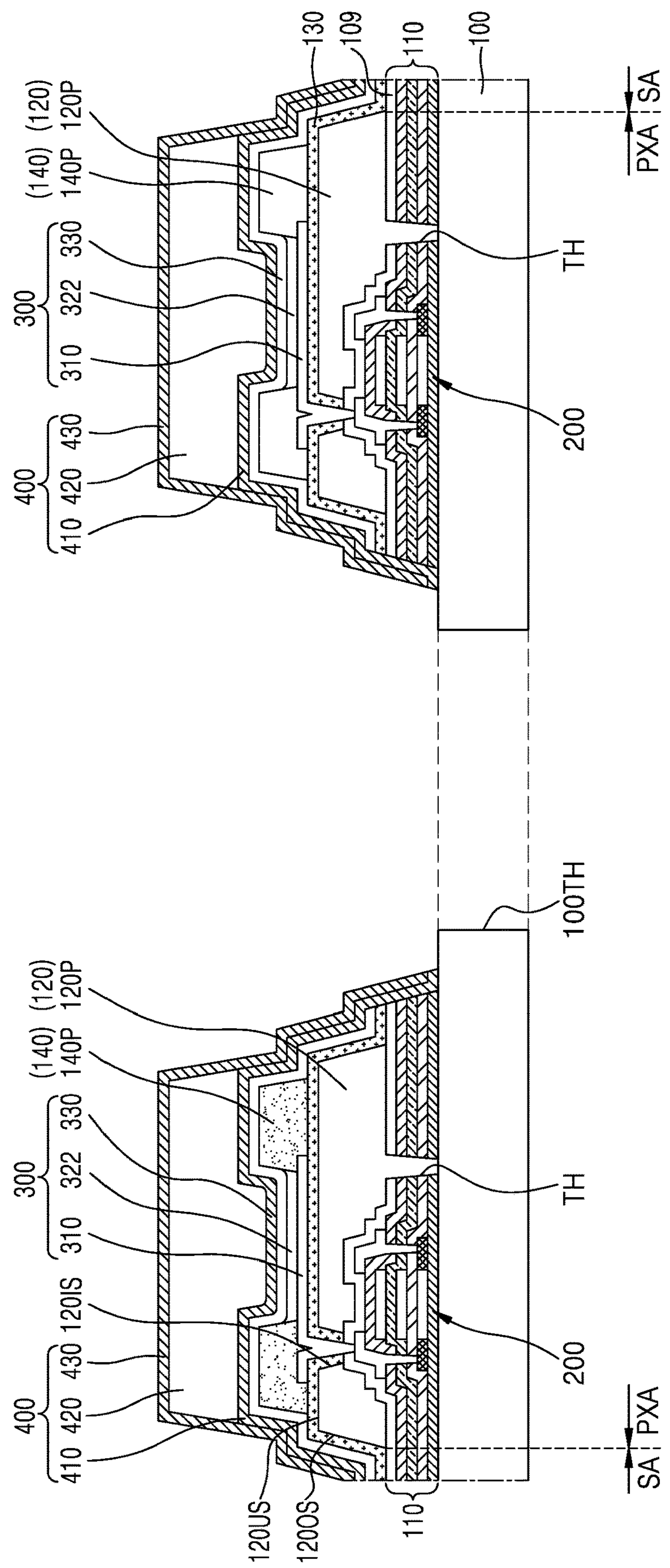
FIG. 16 is a schematic cross-sectional view of a display device according to other embodiments.

FIG. 16 is a schematic cross-sectional view of a display device according to other embodiments.

Referring to FIG. 16, the structures of the first organic pattern part 120P of the first organic layer 120 and the second organic pattern part 140P of the second organic layer 140 described above may also be applied to a display device having a stretchable structure.

The flexible substrate 100 of FIG. 16 may include a through pattern 100TH that penetrates the flexible substrate 100 for stretchable characteristics.

Pixels may be arranged with the through pattern 100TH therebetween. The light-emitting element 300 includes the pixel electrode 310, the emission layer 322, and the opposite electrode 330. Though it is shown in FIG. 16 that the opposite electrode 330 is arranged for each pixel, the opposite electrode 330 is provided as one body on the flexible substrate 100.

As such, in the display device in which the through pattern 100TH is formed in the flexible substrate 100, the pixels with the through pattern 100TH therebetween may be individually encapsulated.

Although the disclosure has been described with reference to the embodiments shown in the drawings, these are only examples, and those of ordinary skill in the art will appreciate that various modifications and other equivalent embodiments may be made therefrom. Therefore, the true technical protection scope of the disclosure should be defined by the technical ideas of the appended claims.

The invention claimed is:

1. A display device comprising:

a flexible substrate;

a pixel circuit layer arranged on the flexible substrate, comprising a thin-film transistor, and defining a through hole extending to the flexible substrate;

a first organic layer arranged on the pixel circuit layer, in contact with the flexible substrate through the through hole, and defining a first opening above the thin-film transistor and exposing at least a portion of an upper surface of the pixel circuit layer;

an inorganic layer arranged on the first organic layer to cover an upper surface of the first organic layer, and to cover sidewalls of the first organic layer that define the first opening;

a pixel electrode arranged on the inorganic layer; and an encapsulation layer arranged on the pixel electrode, and comprising a first inorganic encapsulation layer, a second inorganic encapsulation layer, and an organic encapsulation layer between the first inorganic encapsulation layer and the second inorganic encapsulation layer.

2. The display device of claim 1, wherein the inorganic layer is in contact with the upper surface of the pixel circuit layer exposed by the first opening.

3. The display device of claim 2, wherein the upper surface of the pixel circuit layer comprises an inorganic material.

4. The display device of claim 1, wherein the inorganic layer defines a second opening positioned in the first opening, and wherein the pixel electrode is electrically connected to the thin-film transistor through the second opening.

5. The display device of claim 4, wherein the pixel circuit layer further comprises an inorganic protective layer covering the thin-film transistor and comprising an inorganic material, and wherein the second opening extends to penetrate the inorganic protective layer.

6. The display device of claim 1, wherein the inorganic layer extends to cover a side surface of the first organic layer.

7. The display device of claim 1, wherein the first organic layer comprises an organic material, and wherein the through hole is filled with the organic material.

8. The display device of claim 1, wherein the first organic layer is in direct contact with the flexible substrate through the through hole.

9. The display device of claim 1, further comprising a second organic layer arranged on the inorganic layer and defining an emission area by covering an edge of the pixel electrode and exposing a central portion of the pixel electrode.

10. The display device of claim 1, wherein the flexible substrate defines a through pattern penetrating the flexible substrate.

11. The display device of claim 1, wherein the encapsulation layer extends to cover an outer surface of the first organic layer.

12. The display device of claim 11, wherein the first inorganic encapsulation layer of the encapsulation layer is in surface contact with the outer surface of the first organic layer.

13. The display device of claim 1, wherein the thin-film transistor comprises a semiconductor layer, a gate electrode overlapping at least a portion of the semiconductor layer, and a source electrode and a drain electrode connected to the semiconductor layer, and wherein the portion of the upper surface of the pixel circuit layer comprises at least one of the source electrode or the drain electrode.

14. The display device of claim 13, wherein the inorganic layer is in surface contact with the upper surface of the pixel circuit layer exposed through the first opening.

15. The display device of claim 14, wherein the inorganic layer defines a second opening exposing at least one of the source electrode and the drain electrode.

16. The display device of claim 15, wherein the pixel electrode is in electrical contact with at least one of the source electrode or the drain electrode through the second opening.

17. The display device of claim 1, wherein the flexible substrate comprises an organic material.

18. The display device of claim 17, wherein the first organic layer contacts the flexible substrate through the through hole.

19. A display device comprising:

a flexible substrate;

a pixel circuit layer arranged on the flexible substrate, and comprising a plurality of thin-film transistors and defining at least one through hole extending to the flexible substrate;

a first organic layer arranged on the pixel circuit layer, in contact with the flexible substrate through the through hole, and comprising a plurality of organic pattern parts patterned in an island shape;

an inorganic layer arranged on the first organic layer to cover an upper surface of the first organic layer;

a first pixel electrode, a second pixel electrode, and a third pixel electrode arranged on the inorganic layer and arranged on the plurality of organic pattern parts, respectively; and an encapsulation layer arranged on the first pixel electrode, the second pixel electrode, and the third pixel electrode, the encapsulation layer comprising a first inorganic encapsulation layer, a second inorganic encapsulation layer, and an organic encapsulation layer between the first inorganic encapsulation layer and the second inorganic encapsulation layer.

20. The display device of claim 19, wherein the pixel circuit layer comprises an inorganic material, wherein the pixel circuit layer comprises a separation area in which the plurality of organic pattern parts are spaced apart from each other to expose at least a portion of an upper surface of the pixel circuit layer, and wherein the pixel circuit layer is in contact with the separation area.

21. The display device of claim 19, wherein the through hole is provided as at least one through hole under each of the plurality of organic pattern parts to respectively correspond to the plurality of organic pattern parts, and wherein each of the plurality of organic pattern parts contacts the flexible substrate through the at least one through hole.

22. The display device of claim 19, further comprising:

a first intermediate layer arranged on the first pixel electrode for emitting light of a red wavelength, a second intermediate layer arranged on the second pixel electrode for emitting light of a green wavelength, and a third intermediate layer arranged on the third pixel electrode for emitting light of a blue wavelength; and an opposite electrode covering the first intermediate layer, the second intermediate layer, and the third intermediate layer.

23. The display device of claim 19, wherein the flexible substrate comprises an organic material.

* * * * *